US012387991B2

(12) United States Patent
Yeh et al.

(10) Patent No.: US 12,387,991 B2
(45) Date of Patent: Aug. 12, 2025

(54) MANUFACTURING METHOD OF SEMICONDUCTOR PACKAGE

(71) Applicant: Taiwan Semiconductor Manufacturing Company, Ltd., Hsinchu (TW)

(72) Inventors: Shu-Shen Yeh, Taoyuan (TW); Che-Chia Yang, Taipei (TW); Chin-Hua Wang, New Taipei (TW); Yu-Sheng Lin, Hsinchu County (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/674,930

(22) Filed: May 27, 2024

(65) Prior Publication Data

US 2024/0312852 A1    Sep. 19, 2024

Related U.S. Application Data

(62) Division of application No. 17/460,349, filed on Aug. 30, 2021, now Pat. No. 12,033,906.

(51) Int. Cl.
*H01L 23/10*    (2006.01)
*H01L 21/48*    (2006.01)
(Continued)

(52) U.S. Cl.
CPC .......... *H01L 23/10* (2013.01); *H01L 21/4817* (2013.01); *H01L 23/053* (2013.01);
(Continued)

(58) Field of Classification Search
CPC ... H01L 23/10; H01L 21/4817; H01L 23/053; H01L 25/0655; H01L 23/3128; H01L 24/92; H01L 21/50; H01L 23/04; H01L 23/5385; H01L 23/3675; H01L 25/50; H01L 23/49816; H01L 23/585; H01L 25/0652; H01L 25/105; H01L 25/18; H01L 23/02; H01L 21/52; H01L 23/373
See application file for complete search history.

(56) References Cited

U.S. PATENT DOCUMENTS 8,445,331 B2 * 5/2013 Kadakia ............... H01L 23/433
                                                    438/126
2014/0217575 A1 * 8/2014 Hung .................. H01L 23/473
                                                    257/713
(Continued)

*Primary Examiner* — Patricia D Valenzuela
(74) *Attorney, Agent, or Firm* — JCIPRNET

(57) ABSTRACT

A manufacturing method of a semiconductor package includes the following steps. A first semiconductor device is provided over a substrate, wherein the first semiconductor device is offset toward an edge of the substrate. A ring structure is attached to the substrate by a first adhesive layer, wherein the ring structure surrounds the first semiconductor device and comprises an overhang portion cantilevered over the edge of the substrate. A lid structure is attached to the ring structure by a second adhesive layer, wherein the lid structure covers the first semiconductor device and comprises an extending portion covering the overhang portion.

20 Claims, 10 Drawing Sheets

(51) Int. Cl.
*H01L 23/053* (2006.01)
*H01L 25/065* (2023.01)
*H01L 23/00* (2006.01)
*H01L 23/31* (2006.01)

(52) U.S. Cl.
CPC ...... *H01L 25/0655* (2013.01); *H01L 23/3128* (2013.01); *H01L 24/92* (2013.01)

(56) References Cited

U.S. PATENT DOCUMENTS

2015/0262973 A1\* 9/2015 Wang .................. H01L 23/3128
438/109
2020/0176357 A1\* 6/2020 Yu ........................... H01L 23/10

\* cited by examiner

MANUFACTURING METHOD OF SEMICONDUCTOR PACKAGE

CROSS-REFERENCE TO RELATED APPLICATION

This is a divisional application of patent application Ser. No. 17/460,349, filed on Aug. 30, 2021. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
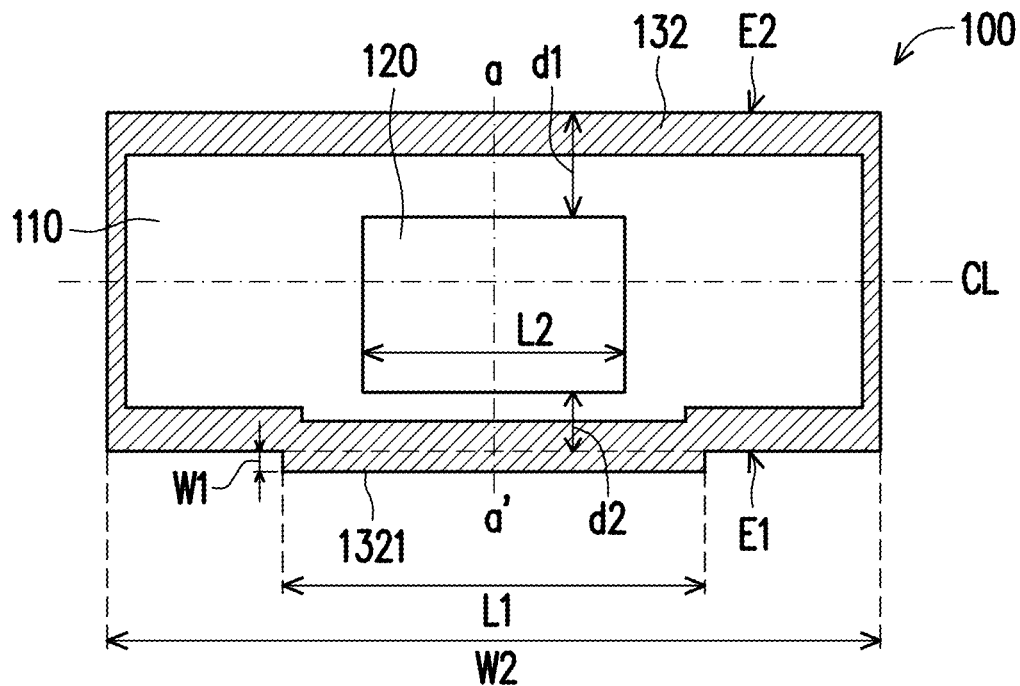
FIG. 1 illustrates a schematic top view of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of forming the same are provided in accordance with various exemplary embodiments. Before addressing the illustrated embodiments specifically, certain advantageous features and aspects of the present disclosed embodiments will be addressed generally. The semiconductor package may be adopted for improving stress concentration and/or delamination issues during manufacturing process. Described below is a structure having a semiconductor device disposed over a substrate in an offset position (e.g., shift from a center axis of the substrate). Correspondingly, a ring structure surrounding the semiconductor device is cantilevered over the edge of the substrate, which increases a bonding area between the ring structure and the lid structure disposed thereon, so as to avoid or reduce stress concentration and/or delamination issues, especially in the adhesive layer and around die corners. In addition, the manufacturing process can be simplified and production cost can be reduced. The intermediate stages of forming the package are illustrated in accordance with some embodiments. Some variations of some embodiments are discussed. Throughout the various views and illustrative embodiments, like reference numbers are used to designate like elements.

Figure 2:
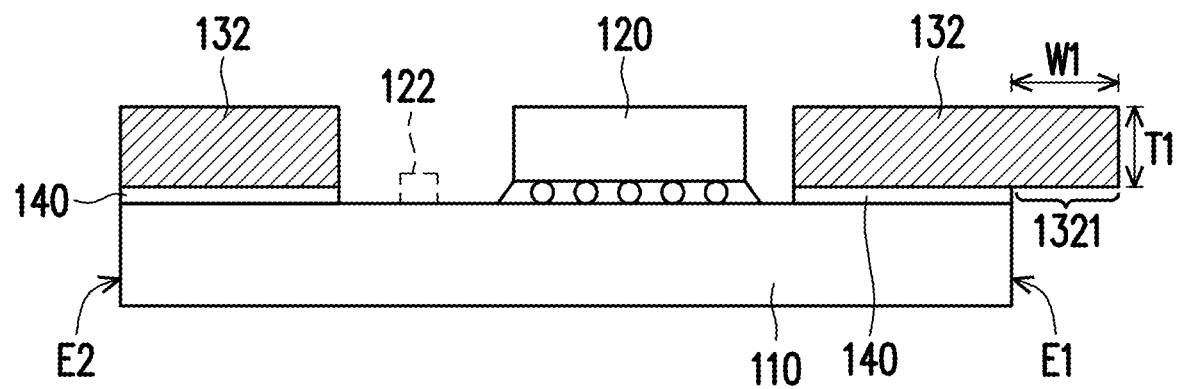
FIG. 2 illustrates a schematic cross sectional view of the semiconductor package in FIG. 1 along a-a' line according to some embodiments of the present disclosure.

FIG. 1 illustrates a schematic top view of a semiconductor package according to some embodiments of the present disclosure. FIG. 2 illustrates a schematic cross sectional view of the semiconductor package in FIG. 1 along a-a' line according to some embodiments of the present disclosure. With now reference to FIG. 1 and FIG. 2, in some embodiments, a semiconductor package 100 includes a substrate 110, a (first) semiconductor device 120, and a ring structure 132. In some embodiments, the substrate 110 is a package substrate, which may be a built-up substrate or a laminate substrate. In some other embodiments, the substrate 110 may be an interposer, which includes a dielectric substrate or a semiconductor substrate (such as a silicon substrate). Conductive redistribution lines (not shown) are formed in the substrate 110 to electrically inter-couple the conductive features on opposite sides of the substrate 110. In some embodiments.

In accordance with some embodiments of the disclosure, the semiconductor device 120 is disposed over the substrate 110. The semiconductor device 120 may be a device die that include active devices such as transistors. In some embodiments, the semiconductor device 120 may include a workpiece, which includes silicon or other semiconductor materials that may be covered by an insulating layer, for example. The workpieces of the semiconductor device 120 may include active components or circuits, not shown, such as transistors, diodes, resistors, capacitors, etc. In some embodiments, the semiconductor device 120 is a logic die, which may include a system on chip (SoC), and may include elements such as a CPU (central processing unit), a memory controller, and other related system elements. In some embodiments, the semiconductor device 120 may include one or more stacked dielectric, conductive, and/or semiconductor layers. For example, the semiconductor device 120 may correspond to one or more overlaid memory devices (e.g., flash memory and DRAM memory), one or more processors or processor cores (e.g., CPU cores), other digital logic, or combinations thereof.

In accordance with some embodiments of the disclosure, the semiconductor device 120 is mounted on over the substrate 110 in an offset position toward an edge E1 of the substrate 110. In other words, the semiconductor device 120 is deviated from a center axis (long axis) CL (e.g., the center axis CL parallel to the edge E1) of the substrate 110 by a certain distance. Accordingly, a distance d2 between the edge E1 of the substrate 110 and the respective (closest) side of the semiconductor device 120 is substantially smaller than a distance d1 between an opposite edge E2 (opposite to the edge E1) of the substrate 110 and the respective (closest) side of the semiconductor device 120. In some embodiments, the semiconductor device 120 is disposed in the offset position on the substrate 110 for design and/or layout purposes. For example, the semiconductor device 120 may be offset from the center of the substrate 110 to make room for a surface mounted device 122, but the disclosure is not limited thereto. In such embodiment, the surface mounted device 122 may be disposed over the substrate 110 and adjacent to the semiconductor device 120. In some embodiments, the surface mounted device 122 is closer to the opposite edge E2 of the substrate 110. In some embodiments, the surface mounted device 122 may be a passive device (e.g., capacitors, resistors, inductors, varactors, and/or the like). The placement of the surface mounted device 122 may include surface mount technology (SMT) connections, for example.

In some embodiments, a ring structure 132 is disposed over the substrate 110 and surrounding the semiconductor device 120. In some embodiments, the ring structure 132 may be thermally conductive, and formed of metals such as copper, aluminum, or the like. The ring structure 132 may have a ring shape in the top view as it is shown in FIG. 1, and may be a full (continuous) ring or a partial (discontinuous) ring. The ring structure 132 includes an overhang portion 1321 that is cantilevered over the edge E1 of the substrate 110. In some embodiments, a major outline of the ring structure 132 is substantially aligned with an outline of the substrate 110 from a top view, and the overhang portion 1321 is protruded from the major outline as it is shown in FIG. 1. In some embodiments, a length L1 of the overhang portion 1321 is substantially greater than a length L2 of the respective (closer) side of the semiconductor device 120, and the length L1 is substantially equal to or shorter than a length W2 of the edge E1 of the substrate 110. In some embodiments, the length L1 of the overhang portion 1321 may be substantially greater than a width W1 of the overhang portion 1321. In an alternative embodiment, the length L1 may be substantially shorter than the width W1. In some embodiments, a thickness T1 of the overhang portion 1321 may be substantially greater than the width W1 of the overhang portion 1321. In an alternative embodiment, the thickness T1 may be substantially equal to or shorter than the width W1. However, the dimension relationships between components described above are merely for illustration, and not intended to limit the disclosure.

In some embodiments, the semiconductor package 100 may further include a (first) adhesive layer 140 disposed between the substrate 110 and the ring structure 132 for attaching the ring structure 132 to the substrate 110. The adhesive layer 140 may include a thermal interface material (TIM) dispensed on to the top surface of the substrate 110. TIM has a relatively higher thermal conductivity (hence the name) than typical adhesive materials. In some embodiments, the adhesive layer 140 may include an organic material, and may also act as an adhesive. In some embodiments, the adhesive layer 140 may include a polymer matrix, a phase change polymer, a silicone-based matrix, a matrix additive (fluxing agent), a filler material (a metallic core with an organic solderability preservative coating), or the like.

In general, during process, the different materials, which make up the semiconductor package 100, expand and contract at different rates (i.e. relative expansion rates) which imply a mismatch in their coefficient of thermal expansion (CTE). This CTE mismatch of the materials in the semiconductor package 100 (e.g., materials of substrate 110, semiconductor device 120, adhesive layer 140, and ring structure 132) is responsible for reliability issues such as stress concentration, delamination, etc., especially in the adhesive layer and around die corners. In the case of semiconductor package 100 being asymmetrical (e.g., the semiconductor device 120 being offset from the center axis CL of the substrate 110), the semiconductor package 100 would be even more mechanically unbalanced. This asymmetry, along with different materials used in the packaging (e.g., CTE mismatch between materials of substrate 110, semiconductor device 120, adhesive layer 140, and ring structure 132, etc.), cause both mechanical and thermal stresses, which in turn lead to package warpage and co-planarity issues. Package warpage can place stress on the solder joints of the semiconductor device 120, especially around device corners, leading to detachment of some of the solder bumps and/or physical damage to the device 120. Furthermore, such package warp can cause detachment (e.g., delamination) of semiconductor device 120 from the ring structure 132 by adhesive layer 140.

If the outline of the ring structure 132 is entirely aligned with the outline of the substrate 110 from a top view (i.e., no overhang portion 1321), the bulk of the ring structure 132 on the edge E1 would be smaller than that on the opposite edge E2. In addition, bonding (contact) area between the substrate 110 and the ring structure 132 on the edge E1 would also be smaller than that on the opposite edge E2, which would make worse the reliability issue such as stress concentration, delamination, etc., especially in the adhesive layer 140 and around die corners. Therefore, the ring structure 132 is configured with the overhang portion 1321 cantilevered over the edge E1 of the substrate 110, which increases the mechanical strength of the semiconductor package 100 and balances out the proportion of materials on each side. Thereby, reliability issues such as stress concentration (in adhesive layer around die corners, for example) and delamination due to CTE mismatch in the asymmetrical semiconductor package 100 can be avoided or at least significantly reduced. In experimental perspective, the warpage of the semiconductor package 100 is reduced about 5% to 10% compared to the asymmetrical semiconductor package without the overhang portion 1321.

Figure 3:
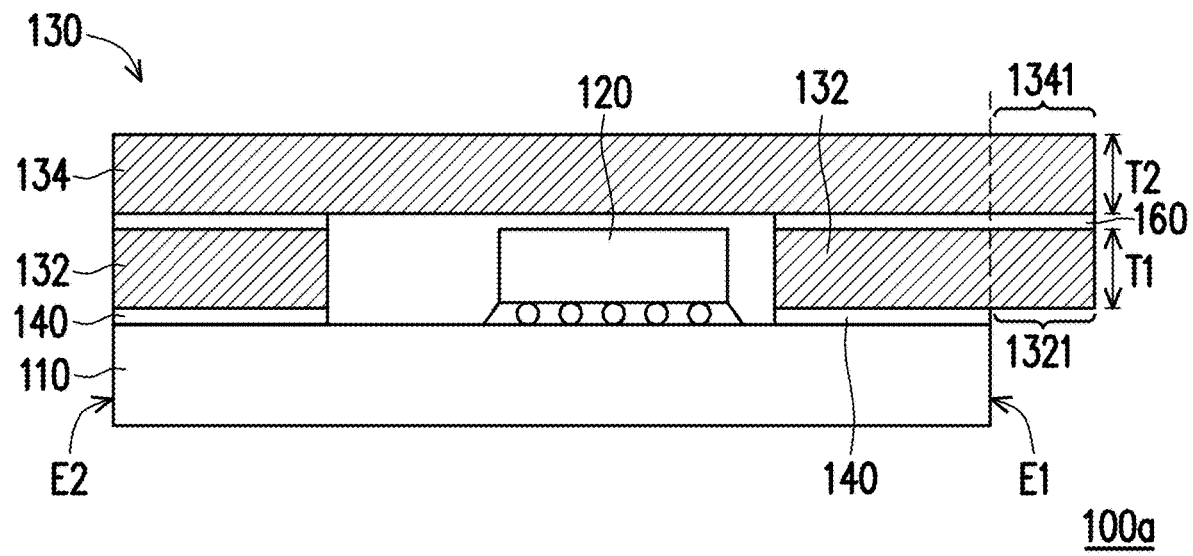
FIG. 3 illustrates a schematic cross sectional view of the semiconductor package according to some embodiments of the present disclosure.

FIG. 3 illustrates a schematic cross sectional view of the semiconductor package according to some embodiments of the present disclosure. It is noted that the semiconductor package 100a shown in FIG. 3 contains many features same as or similar to the semiconductor package 100a disclosed earlier with FIG. 1 and FIG. 2. For purpose of clarity and simplicity, detail description of same or similar features may be omitted, and the same or similar reference numbers denote the same or like components. The main differences between the semiconductor package 100a shown in FIG. 3 and the semiconductor package 100 shown in FIG. 1 and FIG. 2 are described as follows.

With now reference to FIG. 3, in some embodiments, the semiconductor package 100a may further include a lid structure 134 disposed over the ring structure 132 and covering the semiconductor device 120. The lid structure 134 may be formed of a metal or a metal alloy that has a high thermal conductivity. The lid structure 134 may be formed of the same material as the ring structure 132 is formed of. In an alternative embodiment, the lid structure 134 and the ring structure 132 may be formed of different materials. The lid structure 134 includes an extending portion 1341, which covers the overhang portion 1321 of the ring structure 132. In some embodiments, an outline of the extending portion 1341 is substantially aligned with an outline of the overhang portion 1321 from a top view (the top view of the lid structure 34 may be reference to FIG. 5, with or without the opening patterns OP). In other words, a side surface of the extending portion 1341 are substantially coplanar with respective side surface of the overhang portion 1321. In one of the implementations, the entire outline of the lid structure 134 may be substantially aligned with the entire outline of the ring structure 132 from a top view (the top view of the outline may be reference to FIG. 5). Accordingly, the ring structure 132 surrounding the semiconductor device 110 and the lid structure 134 covering the semiconductor device 110 are assembled together and jointly form a cover 130. As such, the cover 130, which is disposed over the substrate 110, surrounds and covers the semiconductor device 120. In some embodiments, a major outline of the cover 130 is substantially aligned with an outline of the substrate 110 from a top view, and the overhang portion 1321 along with the extending portion 1341 are protruded from the major outline of the substrate 110. In some embodiments, a thickness T2 of the lid structure 134 may be greater than the thickness T1 of the ring structure 132. In an alternative embodiments, the thickness T2 of the lid structure 134 may be substantially equal to or smaller than the thickness T1 of the ring structure 132. The disclosure is not limited thereto.

In some embodiments, the lid structure 134 may be attached onto the ring structure 132 by an (second) adhesive layer 160. The adhesive layer 160 may include a material that is selected from the same group of candidate materials of adhesive layer 140. In some embodiments, the adhesive layer 160 may also include thermal interface material and be disposed between the lid structure 134 and the ring structure 132. In some embodiments, the adhesive layer 160 is comprehensively distributed over an upper surface of the ring structure 132 that faces the lid structure 134. To be more specific, the adhesive layer 160 completely covers an upper surface of the overhang portion 1321 that faces the extending portion 1341 of the lid structure 134. Thereby, the bonding strength between the ring structure 132 and the lid structure 134 is improved, which increases the mechanical strength of the semiconductor package 100 and balances out the proportion of materials in the semiconductor package 100a. Accordingly, reliability issues such as stress concentration (in the adhesive layer 160, for example) and delamination due to CTE mismatch in the asymmetrical semiconductor package 100a can be avoided or at least significantly reduced. In experimental perspective, the stress in the adhesive layer 160 is reduced about 25% to 35% compared to the cover without the overhang portion, and the warpage of the semiconductor package 100 is reduced about 5% to 10% compared to the asymmetrical semiconductor package without the overhang portion.

Figure 4:
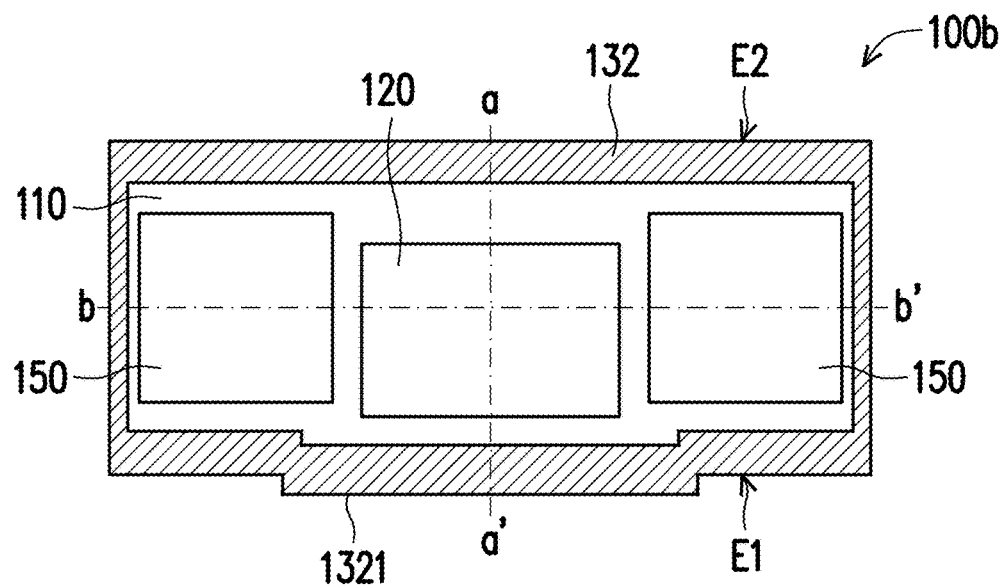
FIG. 4 illustrates a schematic top view of a semiconductor package according to some embodiments of the present disclosure.
Figure 5:
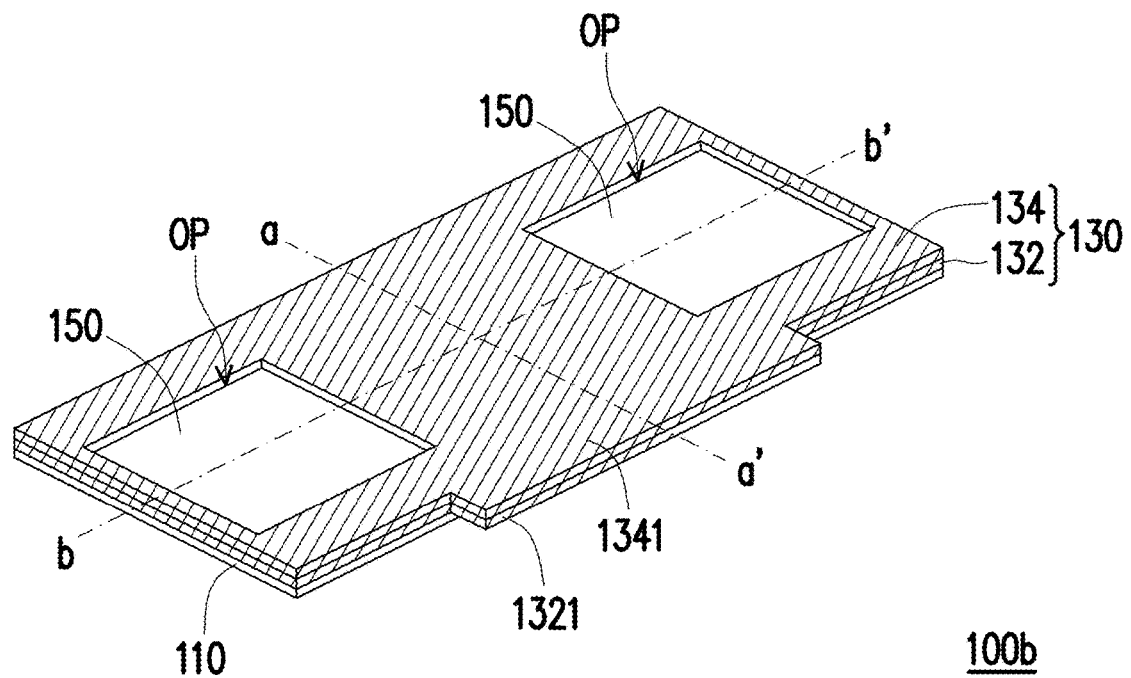
FIG. 5 illustrates a schematic view of a semiconductor package according to some embodiments of the present disclosure.
Figure 6:
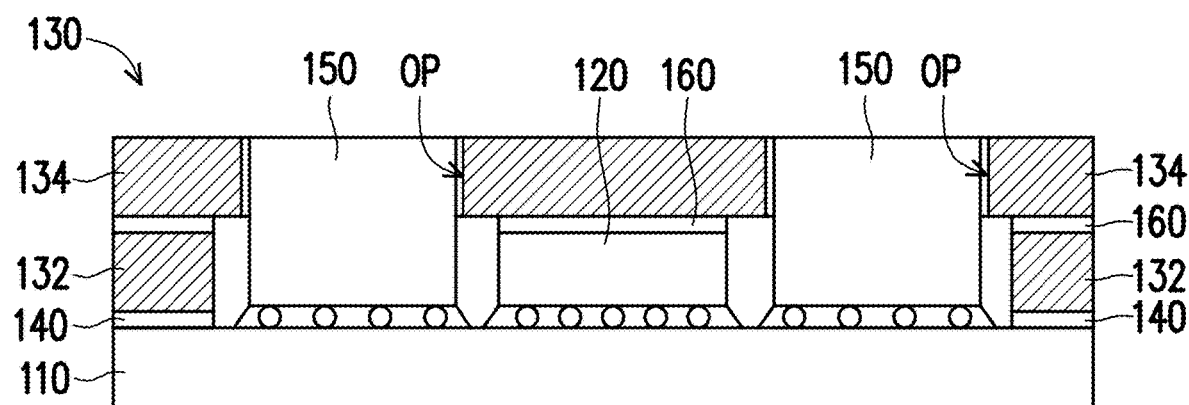
FIG. 6 illustrates a schematic cross sectional view of the semiconductor package in FIG. 5 along b-b' line according to some embodiments of the present disclosure.

FIG. 4 illustrates a schematic top view of a semiconductor package according to some embodiments of the present disclosure. FIG. 5 illustrates a schematic view of a semiconductor package according to some embodiments of the present disclosure. FIG. 6 illustrates a schematic cross sectional view of the semiconductor package in FIG. 5 along b-b' line according to some embodiments of the present disclosure. It is noted that the semiconductor package 100b shown in FIG. 4 to FIG. 6 contains many features same as or similar to the semiconductor packages disclosed earlier. For purpose of clarity and simplicity, detail description of same or similar features may be omitted, and the same or similar reference numbers denote the same or like components. It is noted that, for clarity and simplicity purposes, the lid structure in FIG. 4 is omitted for better illustrating the structure underneath. The main differences between the semiconductor package 100b shown in FIG. 4 to FIG. 6 and the semiconductor packages disclosed earlier are described as follows.

With now reference to FIG. 4 and FIG. 5, in some embodiments, the semiconductor package 100b may further include at least one (second) semiconductor device 150 disposed over the substrate 110. The semiconductor devices 150 are disposed on the substrate 110 in a side by side manner with the semiconductor device 110. In some embodiments, the semiconductor device 120 is surrounded by the semiconductor devices 150. In some embodiments, the semiconductor device 120 is a logic die, and semiconductor devices 150 are memory dies, although semiconductor devices 120 and 150 may be other types of dies having other functions in any combination. In some embodiments, the semiconductor device 120 may be a single system on chip (SoC) die, multiple SoC stacked dies, or the like. In some embodiments, each of the semiconductor devices 150 may be a dynamic random access memory (DRAM), a high bandwidth memory (HBM), a chip scale package (CSP), or the like. While FIG. 4 illustrates the semiconductor package 100b having one semiconductor device 120 and two semiconductor devices 150, other embodiments may include any number of semiconductor device 120 and/or semiconductor device 150. In other embodiment, an encapsulating material (not shown) may encapsulate the semiconductor devices 120 and 150 therein, and the top surfaces of semiconductor devices 120 and 150 may be exposed. It is noted that the cross sectional view of the semiconductor package 100*b* along a-a' line in FIG. 5 may be the same or at least similar to the cross sectional view shown in FIG. 3.

In accordance with some embodiments of the disclosure, the semiconductor devices 150 may be arranged along a center axis (e.g., the center axis CL illustrate in FIG. 1) of the substrate 110 that is parallel to the edge E1 while the semiconductor device 120 is offset (deviated) from the center axis of the substrate 110 by a certain distance. In other words, the semiconductor device 120 is offset (deviated) from a center axis of the semiconductor devices 150 parallel to the edge E1. A surface mounted device (not shown) may be disposed adjacent to the semiconductor device 120 and closer to the opposite edge E2 of the substrate 110. That is, the semiconductor device 120 may be offset from the center of the substrate 110 to make room for a surface mounted device 122, but the disclosure is not limited thereto.

Accordingly, the cover 130 including the ring structure 132 and the lid structure 134 is disposed over the substrate 110 for surrounding and covering the semiconductor devices 120 and 150. The cover 130 includes the overhang portion 1321 from the ring structure 132 and the extending portion 1341 from the lid structure 134 assembled together to be cantilevered over the edge E1 of the substrate 110. In some embodiments, a major outline of the cover 130 is substantially aligned with an outline of the substrate 110 from a top view, and the overhang portion 1321 along with the extending portion 1341 is protruded from the major outline.

With now reference to FIG. 5 and FIG. 6, in some embodiments, the semiconductor devices 120 and 150 each have their own heights, which may be equal to one another or different from one another. Accordingly, in the embodiment of the semiconductor devices 150 are higher than the semiconductor device 120, the cover 130 may further include at least one opening pattern OP corresponding to a back surface of the semiconductor devices 150 (or the semiconductor device(s) whichever is higher) for revealing the back surfaces of the semiconductor devices 150. In some embodiments, the cover 130 includes opening patterns OP, with each of semiconductor devices 150 extending into one of the opening patterns OP. The quantity of the opening patterns OP may corresponding to the quantity of the semiconductor devices 150, or quantity of semiconductor devices 120 and/or 150 that need to extend into the opening patterns OP. In some embodiments, the adhesive layer 160 may be applied to the back surface of the semiconductor device 120 (or the semiconductor device(s) whichever is lower in height), so, when the cover 130 is disposed over, the semiconductor device 120 can be thermally coupled to the cover 130 directly through the adhesive layer 160. As such, the depths and the widths of the opening patterns OP in the cover 130 may be chosen, so that the adhesive layer 160 have small thicknesses in order to have good heat dissipating efficiency.

Figure 7:
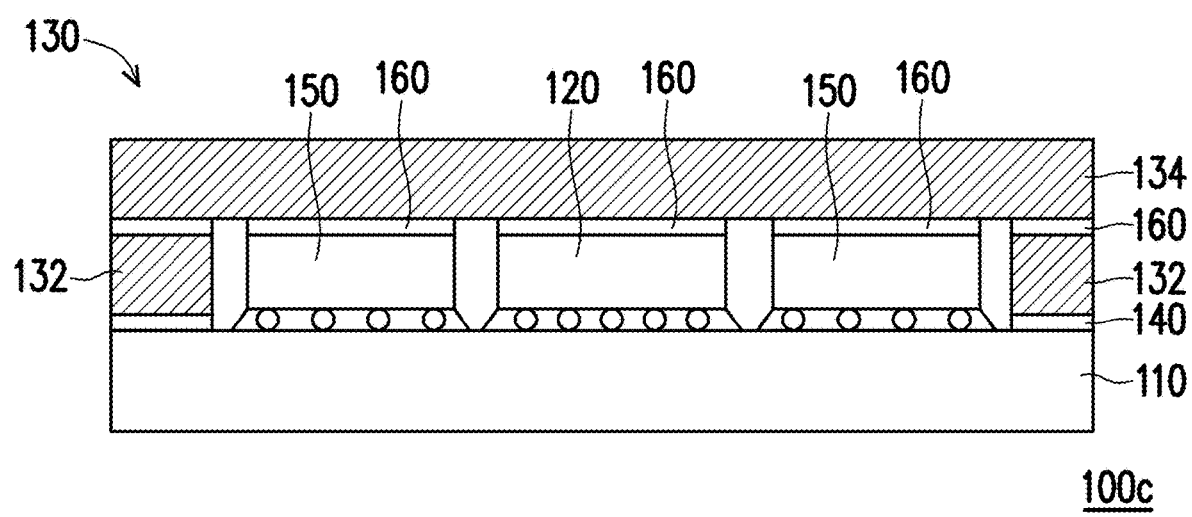
FIG. 7 illustrates a schematic cross sectional view of a semiconductor package according to some embodiments of the present disclosure.

FIG. 7 illustrates a schematic cross sectional view of a semiconductor package according to some embodiments of the present disclosure. It is noted that the semiconductor package 100*c* shown in FIG. 7 contains many features same as or similar to the semiconductor package 100*b* shown in FIG. 4 to FIG. 6. For purpose of clarity and simplicity, detail description of same or similar features may be omitted, and the same or similar reference numbers denote the same or like components. The main differences between the semiconductor package 100*c* shown in FIG. 7 and the semiconductor package 100*b* disclosed earlier are described as follows.

In accordance with some embodiments of the disclosure, as shown in FIG. 7, for the semiconductor package 100*c* that the heights of the semiconductor devices 120 and 150 are substantially the same or similar to one another, the cover 130 may cover the semiconductor devices 120 and 150 altogether. That is, the cover 130 may not have any opening patterns shown in FIG. 6. In some embodiments, the adhesive layer 160 may be applied to the back surfaces of the semiconductor devices 120 and 150, so that, when the cover 130 is disposed thereon, the semiconductor devices 120 and 150 can be thermally coupled to the cover 130 directly through the adhesive layer 160. Namely, the adhesive layer 160 is disposed between and in contact with the cover 130 and the semiconductor devices 120 and 150 in order to have good heat dissipating efficiency. In such embodiment, the heights of the semiconductor devices 120 and 150 may still be different from one another and the adhesive layer 160 may be applied to the back surfaces of the semiconductor devices 120 and 150 with different thickness to compensate the height differences of the semiconductor devices 120 and 150.

Figure 8:
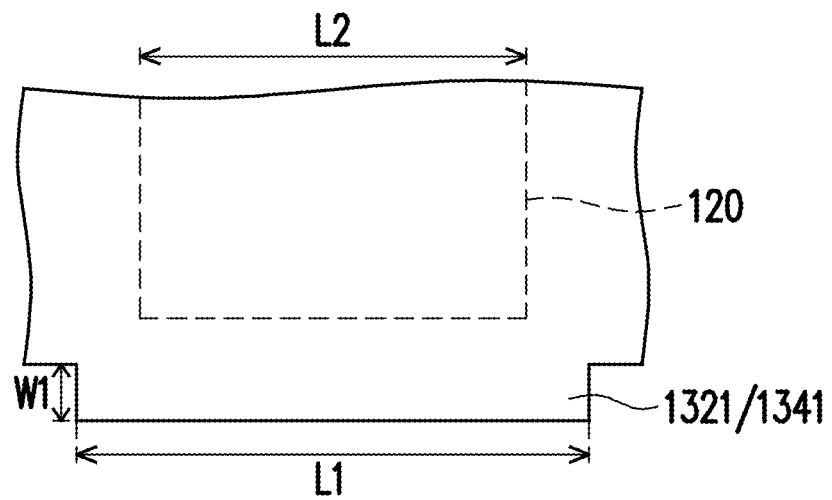
FIG. 8 illustrates a partial enlarged top view of a semiconductor package according to some embodiments of the present disclosure.

FIG. 8 illustrates a partial enlarged top view of a semiconductor package according to some embodiments of the present disclosure. Referring to FIG. 8, in some embodiments, as it is mentioned earlier, the CTE mismatch of the materials in the semiconductor package is responsible for reliability issues such as stress concentration, delamination, etc. In the case of semiconductor package being asymmetrical (e.g., the semiconductor device 120 being offset from the center axis CL of the substrate 110), the asymmetry, along with different materials used in the packaging would cause both mechanical and thermal stresses concentration, especially around the corners of the semiconductor device 120 that is closer to the edge E1. Accordingly, in some embodiments, the length L1 of the overhang portion 1321 and the extending portion 1341 is substantially greater than the length L2 of the semiconductor device 120, so as to ensure the corners of semiconductor device 120 closer to the edge E1 being well surrounded and reinforced by the cover 130. Thereby, the mechanical strength around the corners of semiconductor device 120 closer to the edge E1 can be improved. In the present embodiment, the length L1 of the overhang portion 1321 and the extending portion 1341 is substantially greater than the width of the overhang portion 1321 and the extending portion 1341. In an alternative embodiments, the length L1 of the overhang portion 1321 and the extending portion 1341 may be substantially equal to or smaller than the width of the overhang portion 1321 according to the design and layout requirement of the semiconductor package.

Figure 9:
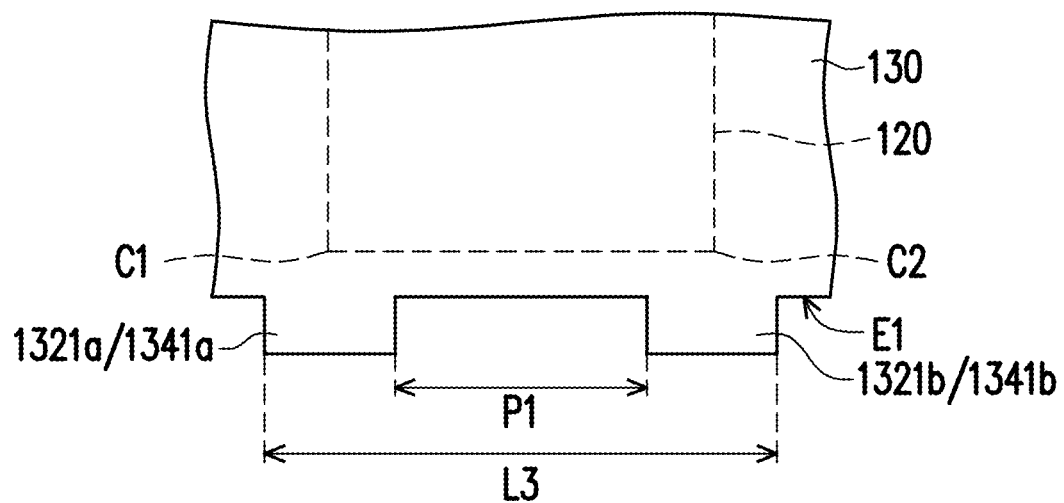
FIG. 9 illustrates a partial enlarged top view of a semiconductor package according to some embodiments of the present disclosure.

FIG. 9 illustrates a partial enlarged top view of a semiconductor package according to some embodiments of the present disclosure. It is noted that the semiconductor package shown in FIG. 9 contains many features same as or similar to the semiconductor packages disclosed earlier. For purpose of clarity and simplicity, detail description of same or similar features may be omitted, and the same or similar reference numbers denote the same or like components. The main differences between the semiconductor package shown in FIG. 9 and the semiconductor packages disclosed earlier are described as follows.

As shown in FIG. 9, in some embodiments, since the area around the corners of the semiconductor device 120 closer to the edge E1 endures more severe mechanical and thermal stresses concentration, the cover 130 may include more than one overhang portions 1321a, 1321b along with more than one corresponding extending portions 1341a, 1341b, which are disposed correspondingly to respective corners (e.g., corners C1, C2) of the semiconductor device 120 that are closer to the edge E1. Accordingly, the corners of semiconductor device 120 closer to the edge E1 can be well surrounded and reinforced by the respective overhang portions 1321a, 1321b and the extending portions 1341a, 1341b, and the mechanical strength around the corners C1, C2 of semiconductor device 120 can be improved. In accordance with some embodiments of the disclosure, a gap P1 between adjacent two of the overhang portions 1321a, 1321b is substantially shorter than a quarter of a distance L3 between two outermost sides of the overhang portions 1321a, 1321b (i.e., P1<L3/4.) The same configuration may also be applied to the extending portions 1341a, 1341b correspondingly. However, the dimension relationships between components described above are merely for illustration, and not intended to limit the disclosure.

FIG. 10 to FIG. 14 illustrate cross sectional views of intermediate stages in the manufacturing of a semiconductor package according to some embodiments of the present disclosure. FIG. 10 to FIG. 14 depict one of the manufacturing processes of one of the semiconductor packages for illustration purpose. The disclosure is not limited thereto. For purpose of clarity and simplicity, detail description of same or similar features may be omitted, and the same or similar reference numbers denote the same or like components.

Figure 10:
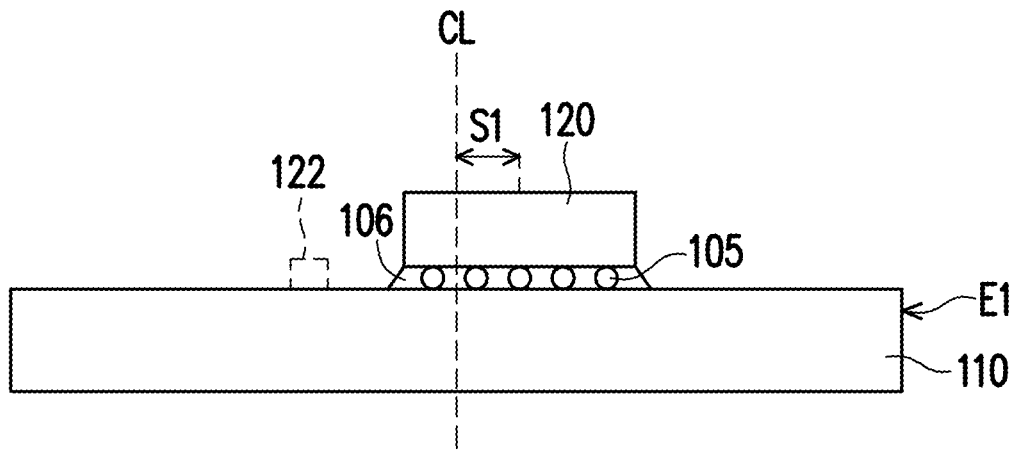
FIG. 10 to FIG. 14 illustrate cross sectional views of intermediate stages in the manufacturing of a semiconductor package according to some embodiments of the present disclosure.
Figure 10A:
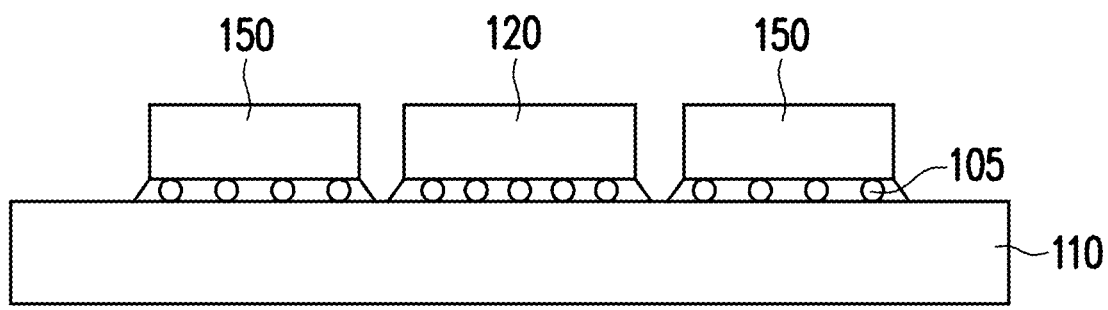

Referring to FIG. 10 and FIG. 10A, it is noted that FIG. 10A illustrates a different cross sectional view of the same structure shown in FIG. 10 for showing the semiconductor devices 150. For example, FIG. 10 shows the cross sectional view along a short axis (e.g., the a-a' line shown in FIG. 4) of the substrate 110, and the FIG. 10A shows the cross sectional view along a long axis (e.g., the b-b' line shown in FIG. 4) of the substrate 110. In accordance with some embodiments of the disclosure, at least one (first) semiconductor device 120 and at least one (second) semiconductor device 150 are provided over the substrate 110. In some embodiments, the substrate 110 may be a package substrate, such as a printed circuit board (PCB), an organic substrate, a ceramic substrate, a motherboard, or the like, which may be a built-up substrate or a laminate substrate. Conductive redistribution lines (not shown) are formed in the substrate 110 to electrically inter-couple the conductive features on opposite sides of the substrate 110. The substrate 110 may further include contacts (e.g., ball grid array (BGA) balls) disposed on a surface opposite to the surface where the semiconductor devices 120 and 150 are disposed. Alternatively, the substrate 110 may include other types of materials and configurations. The semiconductor devices 120 and 150 may be device dies that include active devices such as transistors. In some embodiments, the semiconductor device 120 is a logic die, and the semiconductor devices 150 are memory dies, although the semiconductor devices 120 and 150 may be other types of dies in any combination.

In accordance with some embodiments of the disclosure, the semiconductor device 120, as previously described, is offset from a center axis CL (e.g., long axis) of the substrate 110 by a certain distance S1. For example, the semiconductor device 120 is offset toward the edge E1 of the substrate 110 by the distance S1. In some embodiments, the semiconductor device 120 is disposed in the offset position on the substrate 110 for design and/or layout purposes. For example, the semiconductor device 120 may be offset from the center axis CL of the substrate 110 to make room for the surface mounted device 122, but the disclosure is not limited thereto. The semiconductor devices 150 are disposed on the substrate 110 in a side by side manner with the semiconductor device 110 in accordance with various embodiments. In some embodiments, the semiconductor device 120 is surrounded by the semiconductor devices 150. In some embodiments, the semiconductor devices 150 may be arranged along the center axis CL of the substrate 110 that is parallel to the edge E1 while the semiconductor device 120 is offset (deviated) from the center axis CL of the substrate 110 by the certain distance S1.

In some embodiments, the semiconductor devices 120 and 150 are bonded to the top surface of the substrate 110 by a plurality of conductive bumps 105. The conductive bumps 105 are coupled between contact pads (not shown) on the substrate 110 and contact pads (also not shown) on the semiconductor devices 120 and 150. The conductive bumps 105 includes micro bumps in accordance with various embodiments. In some embodiments, the conductive bumps 105 include controlled collapse chip connection (C4) bumps; however, the conductive bumps 105 may alternatively include other types of electrical connections. A reflow process is performed to reflow and bond the conductive bumps 105 to the substrate 110. Subsequently, an underfill 106 may be dispensed between semiconductor devices 120 and 150 and the substrate 110.

Figure 11:
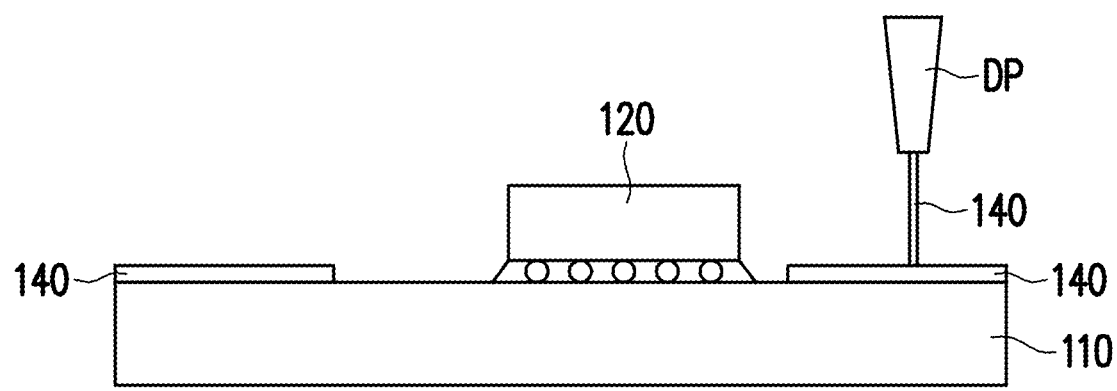

Then, referring to FIG. 11, a dispenser DP dispenses the adhesive layer 140 onto an upper surface of the substrate 110 where the ring structure 132 is to be disposed. In some embodiments, the adhesive layer 140 may include TIM, which has a relatively higher thermal conductivity (hence the name) than typical adhesive materials. The adhesive layer 140 may include an organic material, and may also act as an adhesive. In some embodiments, the adhesive layer 140 includes a polymer matrix, a phase change polymer, a silicone-based matrix, a matrix additive (fluxing agent), a filler material (a metallic core with an organic solderability preservative coating), or the like. The adhesive layer 140 is dispensed in a liquid form that has a high viscosity in accordance with various embodiments. Alternatively, the adhesive layer 140 may be an adhesive tape.

Figure 12:
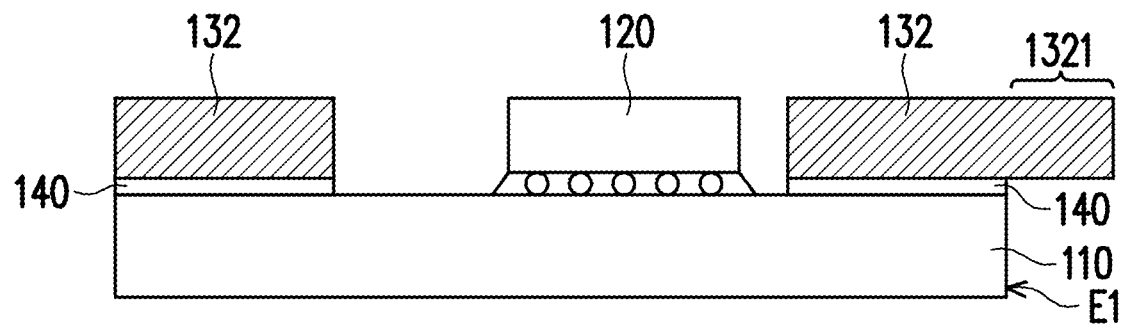

With now reference to FIG. 12, in some embodiments, the ring structure 132, which is thermally conductive, and may be formed of metals such as copper, aluminum, or the like, is mounted over the substrate 110 by the adhesive layer 140. The ring structure 132 may have a ring shape in the top view as it is shown in FIG. 1 and FIG. 4, and may be a full ring or a partial ring. The ring structure 132, as previously described, surrounds the semiconductor devices 120 and 150 and includes an overhang portion 1321 that is cantilevered over the edge E1 of the substrate 110. The pressure may also be used to reduce the thickness of adhesive layer 140. A curing step is then performed to cure the adhesive layer 140, so that the ring structure 132 is adhered to the adhesive layer 140.

Figure 13:
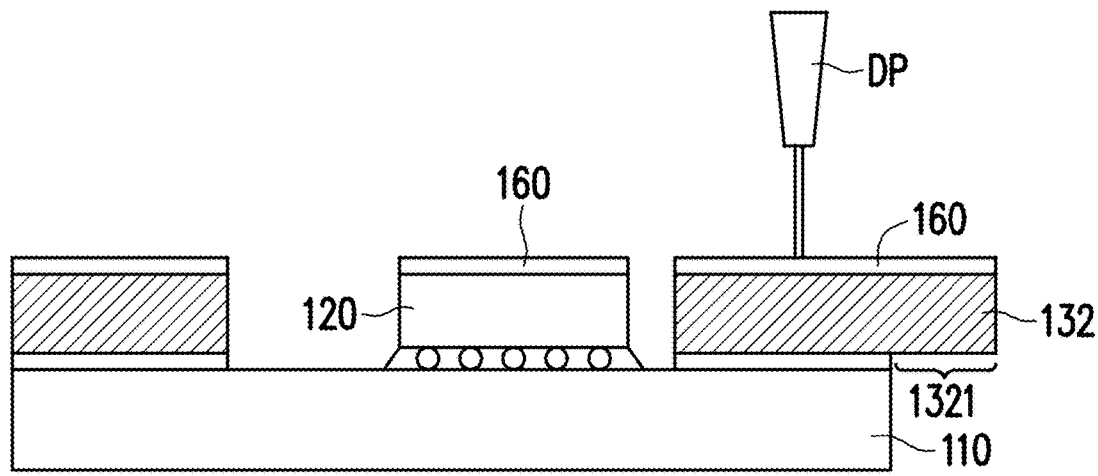
Figure 13A:
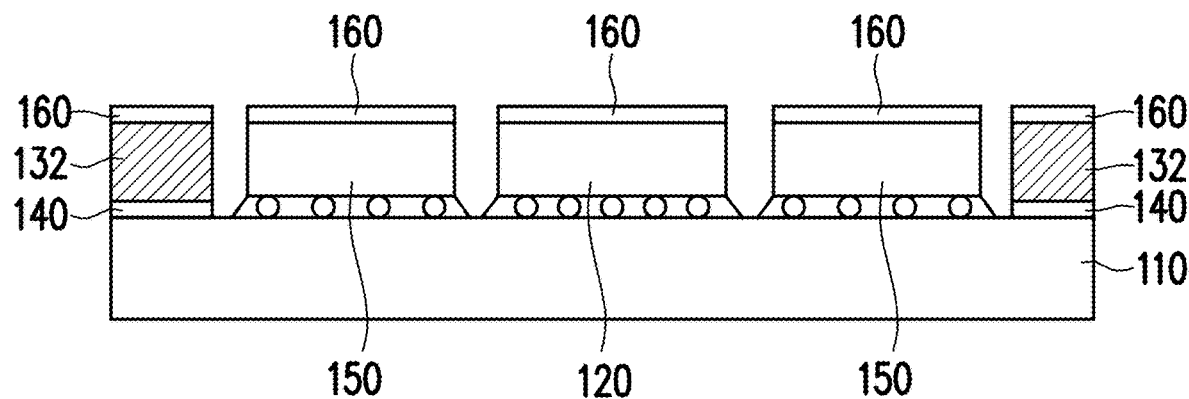

With now reference to FIG. 13 and FIG. 13A, it is noted that FIG. 13A illustrates a different cross sectional view of the same resultant structure shown in FIG. 13 for showing the semiconductor devices 150. For example, FIG. 13 shows the cross sectional view along the short axis (e.g., the a-a' line shown in FIG. 4) of the substrate 110, and the FIG. 13A shows the cross sectional view along the long axis (e.g., the b-b' line shown in FIG. 4) of the substrate 110. In accordance with some embodiments of the disclosure, the dispenser DP further dispenses the adhesive layer 160 over an upper surface of the ring structure 132. In some embodiments, the adhesive layer 160 comprehensively distributed over (i.e., completely covers) an upper surface of the overhang portion 1321 to be bonded with the extending portion 1341 of the lid structure 134. In some embodiments, the adhesive layer 160 may also be dispensed over the back surfaces of the semiconductor devices 120 and 150. The adhesive layer 160 may include a material that is selected from the same group of candidate materials of adhesive layer 140. Furthermore, the adhesive layers 140 and 160 may include the same material, or different materials.

Figure 14:
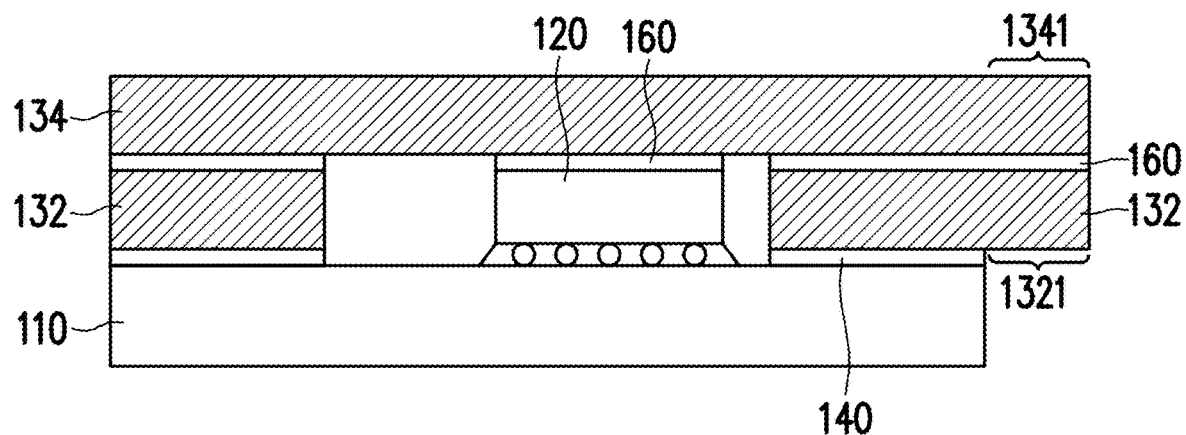

Then, referring to FIG. 14, in some embodiments, the lid structure 134 is mounted over the ring structure 132 by the adhesive layer 160. In accordance with some embodiments of the disclosure, the mounting of the lid structure 134 may use a suction head (not shown), which picks up the lid structure 134 through vacuuming, and places the lid structure 134 over the adhesive layer 160 in accordance with various embodiments. The adhesive layer 160 may be formed of a metal or a metal alloy that has a high thermal conductivity. A pressure may be applied to ensure the good contact of lid structure 134 to the adhesive layer 160 on the ring structure 132 and the semiconductor devices 120, 150 (not shown from this cross sectional view). The pressure may also be used to reduce the thickness of adhesive layer 160 (and adhesive layer 140 if it has not been fully cured yet). A curing step is then performed to cure the adhesive layer 160 (and possibly the adhesive layer 140), so that the lid structure 134 is adhered to the adhesive layer 160. The lid structure, as previously described, covers the semiconductor device 120 and the semiconductor devices 150 (not shown from this cross sectional view) and includes the extending portion 1341 covering the overhang portion 1321. The adhesive layer 160 is comprehensively covers the upper surface of the overhang portion 1321 facing the extending portion 1341, so the overhang portion 1321 is comprehensively bonded with the extending portion 1341. Thereby, the bonding strength between the ring structure 132 and the lid structure 134 is improved, which increases the mechanical strength of the semiconductor package and balances out the proportion of materials in the semiconductor package. Accordingly, reliability issues such as stress concentration (in the adhesive layer 160, for example) and delamination due to CTE mismatch in the asymmetrical semiconductor package can be avoided or at least significantly reduced.

Figure 15:
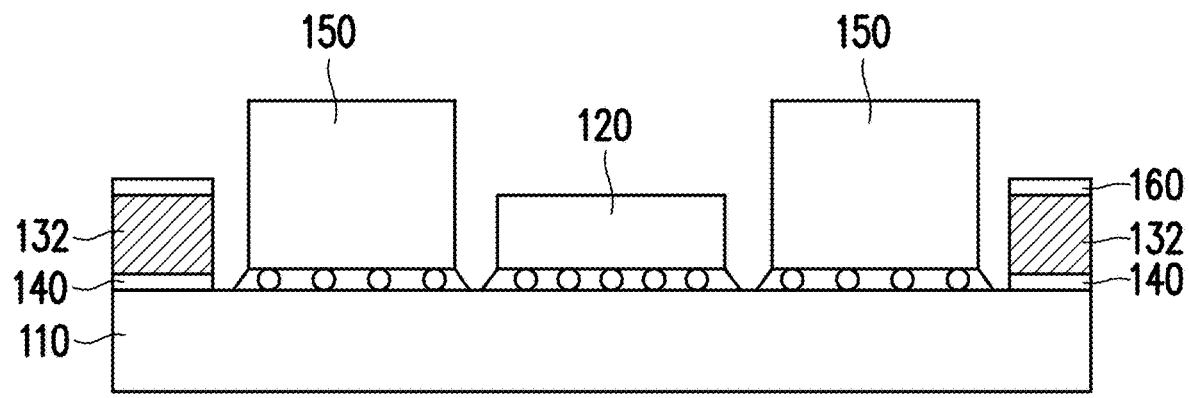
FIG. 15 to FIG. 16 illustrate cross sectional views of intermediate stages in the manufacturing of a semiconductor package according to some embodiments of the present disclosure.
Figure 16:
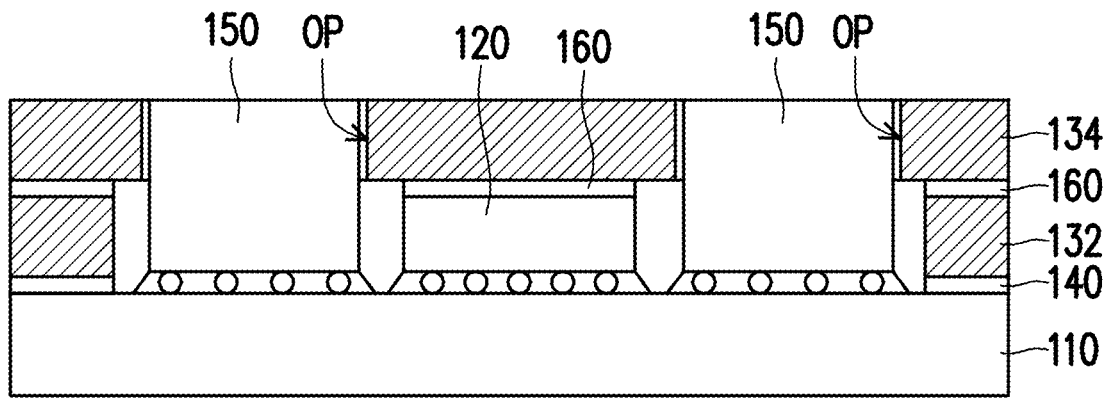

FIG. 15 to FIG. 16 illustrate cross sectional views of intermediate stages in the manufacturing of a semiconductor package according to some embodiments of the present disclosure. It is noted that the manufacturing process of the semiconductor package shown in FIGS. 15 and 16 contains many features same as or similar to the manufacturing process of the semiconductor package disclosed earlier. For purpose of clarity and simplicity, detail description of same or similar features may be omitted, and the same or similar reference numbers denote the same or like components. The main differences between the manufacturing process of the semiconductor package shown in FIGS. 15 and 16 and the manufacturing process of the semiconductor package disclosed earlier are described as follows.

Referring to FIG. 15 and FIG. 16, in some embodiments, the heights of the semiconductor devices 120 and 150 may be different from one another. In the present embodiment, the semiconductor devices 150 are higher than the semiconductor device 120. Accordingly, the lid structure 134, as shown in FIG. 16, may further include opening patterns OP corresponding to the back surfaces of the semiconductor devices 150 (or the semiconductor device(s) whichever is higher), so that a part of the semiconductor devices 150 may be extended into the corresponding opening patterns OP. The quantity of the opening patterns OP may corresponding to the quantity of the semiconductor devices 150, or quantity of semiconductor devices 120 and/or 150 that need to be extended into the opening patterns OP. In some embodiments, the adhesive layer 160 may be applied to the back surface of the semiconductor device 120 (or the semiconductor device(s) whichever is lower in height), so, when the lid structure 134 is disposed over, the semiconductor device 120 can be thermally coupled to the lid structure 134 directly through the adhesive layer 160. As such, the depths and the widths of the opening patterns OP in the lid structure 134 may be chosen, so that the adhesive layer 160 have small thicknesses in order to have good heat dissipating efficiency.

Figure 17:
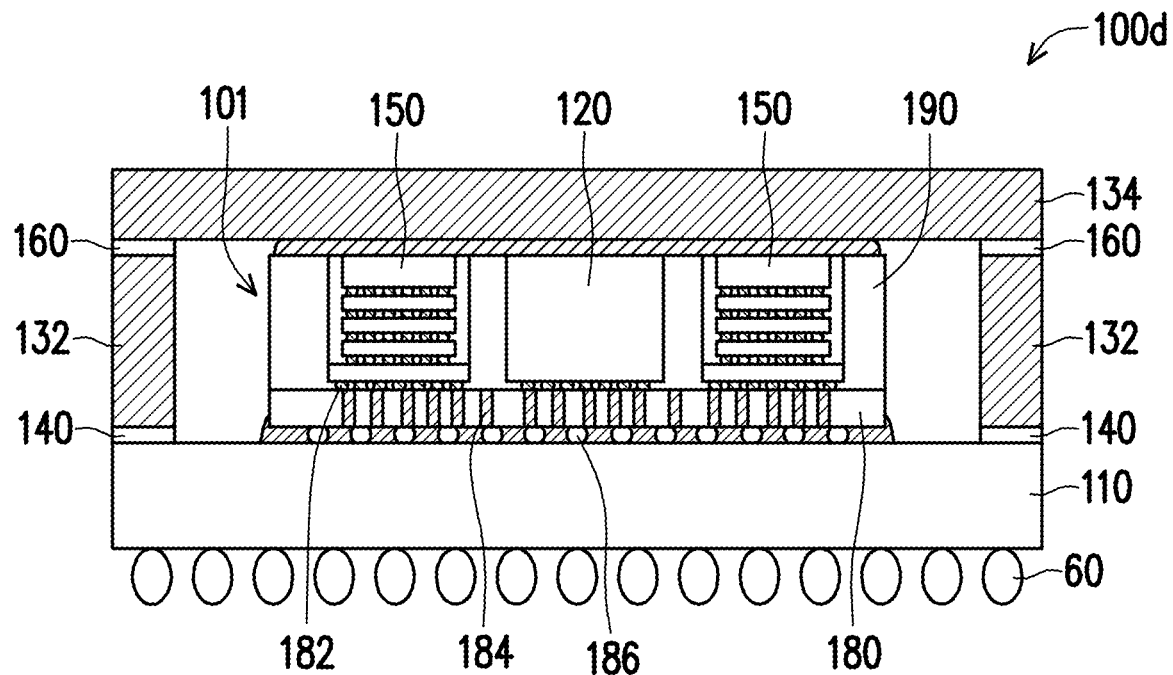
FIG. 17 illustrates a schematic cross sectional view of a semiconductor package according to some embodiments of the present disclosure.

FIG. 17 illustrates a schematic cross sectional view of a semiconductor package according to some embodiments of the present disclosure. It is noted that the semiconductor package shown in FIG. 17 contains many features same as or similar to the semiconductor packages disclosed earlier. For purpose of clarity and simplicity, detail description of same or similar features may be omitted, and the same or similar reference numbers denote the same or like components. The main differences between the semiconductor package shown in FIG. 17 and the semiconductor packages disclosed earlier are described as follows.

Referring to FIG. 17, in some embodiments, a package 101 including the semiconductor device 120 disposed between the semiconductor devices 150 are provided. In some embodiments, the semiconductor device 120 may be a single system on chip (SoC) die, multiple SoC stacked dies, or the like, which is high-power consuming die and may consume a relatively high amount of power, and hence generate a relatively large amount of heat, compared to the semiconductor devices 150. In some embodiments, the semiconductor devices 150 may be HBM (high bandwidth memory) and/or HMC (high memory cube) modules, which may include memory dies bonded to a logic die. In alternative embodiments, the semiconductor devices 120 and 150 may be other chips having other functions.

As illustrated by FIG. 17, the semiconductor devices 120 and 150 are bonded to a top surface of a package component (e.g., interposer 180) through a plurality of connectors 182, which may be micro bumps. In alternative embodiments, the semiconductor devices 120 and 150 may be bonded to a different package component such as a substrate, a printed circuit board (PCB), or the like. The semiconductor device 120, as previously described, is offset from a center axis of the interposer 180. The semiconductor devices 150, as previously described, are disposed on the substrate 110 in a side by side manner with the semiconductor device 110 in accordance with various embodiments. In some embodiments, the semiconductor devices 150 may be arranged along the center axis of the interposer 180 while the semiconductor device 120 is offset (deviated) from the center axis of the interposer 180.

In accordance with some embodiments of the disclosure, the interposer 180 may be a wafer having interconnect structures for electrically connecting active devices (not shown) in the semiconductor devices 120 and 150 to form functional circuits. A connector 182 of the semiconductor devices 120 and 150 is electrically connected to a contact pad on a top side of interposer 180. One of the through substrate vias (TSVs) 184 may electrically connect to one of the connectors 186 on a backside of interposer 180 in accordance with various embodiments. In an embodiment, the connectors 186 may be controlled collapse chip connection (C4) bumps including solder. The connectors 186 may have a larger critical dimension (e.g., pitch) than the connectors 182. Other configurations of interposer 18 may also be used. The semiconductor devices 120 and 150 may be encapsulated in an encapsulating material 190 in accordance with various embodiments.

In some embodiments, the package 101 is then bonded to the substrate 110 using the connectors 186. The resulting chip on wafer on substrate (CoWoS) package is illustrated in FIG. 17. The substrate 110, as previously described, may be any suitable package substrate, such as a printed circuit board (PCB), an organic substrate, a ceramic substrate, a motherboard, or the like. The substrate 110 may be used to interconnect the package 101 with other packages/devices to form functional circuits. In some embodiments, these other packages and devices may also be disposed on a surface of the substrate 110. The substrate 110 may further include contacts 60 (e.g., ball grid array (BGA) balls) disposed on a surface opposite to the package 101 in accordance with various embodiments. The contacts 60 may be used to electrically connect the package 101 to a motherboard (not shown) or another device component of an electrical system. The ring structure 132 and the lid structure 134, as previously described, may be mounted over the substrate 110 to provide mechanical strength to the asymmetrical semiconductor package 100d.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a substrate, a first semiconductor device and a ring structure. The first semiconductor device is disposed over the substrate in an offset position toward an edge of the substrate. The ring structure is disposed over the substrate and surrounds the first semiconductor device. The ring structure includes an overhang portion cantilevered over the edge of the substrate.

In accordance with some embodiments of the disclosure, a semiconductor package includes a substrate, a first semiconductor device and a cover. The first semiconductor device is disposed over the substrate and offset toward an edge of the substrate. The cover is disposed over the substrate, wherein the cover surrounds and covers the first semiconductor device and includes an overhang portion cantilevered over the edge of the substrate.

In accordance with some embodiments of the disclosure, a manufacturing method of a semiconductor package includes the following steps. A first semiconductor device is provided over a substrate, wherein the first semiconductor device is offset toward an edge of the substrate. A ring structure is attached to the substrate by a first adhesive layer, wherein the ring structure surrounds the first semiconductor device and includes an overhang portion cantilevered over the edge of the substrate. A lid structure is attached to the ring structure by a second adhesive layer, wherein the lid structure covers the first semiconductor device and includes an extending portion covering the overhang portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:
    providing a first semiconductor device over a substrate, wherein the first semiconductor device is offset toward an edge of the substrate;
    attaching a ring structure to the substrate by a first adhesive layer, wherein the ring structure surrounds the first semiconductor device and comprises an overhang portion cantilevered over the edge of the substrate, wherein a length of the overhang portion is substantially shorter than a length of the edge of the substrate from a top view; and
    attaching a lid structure to the ring structure by a second adhesive layer, wherein the lid structure covers the first semiconductor device and comprises an extending portion covering the overhang portion.

2. The manufacturing method of the semiconductor package as claimed in claim 1, wherein the second adhesive layer completely covers an upper surface of the overhang portion facing the extending portion.

3. The manufacturing method of the semiconductor package as claimed in claim 1, further comprising:
    performing a curing process for curing the first adhesive layer and the second adhesive layer.

4. The manufacturing method of the semiconductor package as claimed in claim 1 further comprising:
    providing a surface mounted device over the substrate, wherein the surface mounted device is closer to an opposite edge that is opposite to the edge of the substrate.

5. The manufacturing method of the semiconductor package as claimed in claim 1, further comprising:
    providing a second semiconductor device over the substrate in a side by side manner with the first semiconductor device along the edge.

6. The manufacturing method of the semiconductor package as claimed in claim 5, wherein a height of the second semiconductor device is higher than a height of the first semiconductor device, and the lid structure further comprises an opening pattern corresponding to a back surface of the second semiconductor device.

7. The manufacturing method of the semiconductor package as claimed in claim 6, wherein when the lid structure is attached to the ring structure, a part of the second semiconductor device is located within the opening pattern.

8. The manufacturing method of the semiconductor package as claimed in claim 1, wherein the first semiconductor device is bonded to an interposer that is bonded to the substrate.

9. The manufacturing method of the semiconductor package as claimed in claim 8, further comprising:
    bonding a second semiconductor device on the package component in a side by side manner with the first semiconductor device along the edge.

10. The manufacturing method of the semiconductor package as claimed in claim 9, further comprising:
    providing an encapsulating material over the interposer, such that the encapsulating material encapsulates the first semiconductor device and the second semiconductor device.

11. A manufacturing method of a semiconductor package, comprising:
providing a first semiconductor device and a second semiconductor device over a substrate, wherein the first semiconductor device is offset from a center axis of the second semiconductor device that is parallel to an edge of the substrate;
attaching a ring structure to the substrate, wherein the ring structure surrounds the first semiconductor device and the second semiconductor device, and comprises an overhang portion cantilevered over the edge of the substrate; and
attaching a lid structure to the ring structure, wherein the lid structure covers the first semiconductor device and the second semiconductor device, and comprises an extending portion attaching to the overhang portion.

12. The manufacturing method of the semiconductor package as claimed in claim 11, wherein attaching the ring structure to the substrate comprises providing a first adhesive layer over the substrate.

13. The manufacturing method of the semiconductor package as claimed in claim 12, wherein attaching the lid structure to the ring structure comprises providing a second adhesive layer over the ring structure, and the second adhesive layer completely covers an upper surface of the overhang portion facing the extending portion.

14. The manufacturing method of the semiconductor package as claimed in claim 13, further comprising:
performing a curing process for curing the first adhesive layer and the second adhesive layer.

15. The manufacturing method of the semiconductor package as claimed in claim 11 further comprising:
providing a surface mounted device over the substrate, wherein the surface mounted device is closer to an opposite edge that is opposite to the edge of the substrate.

16. A manufacturing method of a semiconductor package, comprising:
providing a semiconductor device over a substrate;
attaching a ring structure to the substrate by a first adhesive layer, wherein the ring structure surrounds the semiconductor device and comprises an overhang portion cantilevered over an edge of the substrate, a major outline of the ring structure is substantially aligned with an outline of the substrate from a top view and the overhang portion protruded from the major outline of the ring structure that is aligned with the edge of the substrate; and
attaching a lid structure to the ring structure by a second adhesive layer, wherein the lid structure covers the semiconductor device and comprises an extending portion attaching to the overhang portion through the second adhesive layer.

17. The manufacturing method of the semiconductor package as claimed in claim 16, wherein the semiconductor device comprises a first semiconductor device and a second semiconductor device arranged in a side-by-side manner, wherein the first semiconductor device is offset toward the edge of the substrate with respect to a center of the second semiconductor device.

18. The manufacturing method of the semiconductor package as claimed in claim 17, wherein the semiconductor device further comprises a surface mounted device disposed at a side of the first semiconductor device, wherein the surface mounted device is closer to an opposite edge that is opposite to the edge of the substrate.

19. The manufacturing method of the semiconductor package as claimed in claim 16, wherein attaching the ring structure to the substrate comprises providing a first adhesive layer over the substrate, and attaching the lid structure to the ring structure comprises providing a second adhesive layer over the ring structure.

20. The manufacturing method of the semiconductor package as claimed in claim 19, wherein the second adhesive layer completely distributed an upper surface of the overhang portion facing the extending portion.

* * * * *